US012127365B1

(12) United States Patent
Blumenthal et al.

(10) Patent No.: US 12,127,365 B1
(45) Date of Patent: Oct. 22, 2024

(54) MULTI-POSITION PDU MOUNTING BRACKET

(71) Applicant: ZT Group Int'l, Inc., Secaucus, NJ (US)

(72) Inventors: Stephen Blumenthal, Secaucus, NJ (US); Philip Megnin, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 17/962,617

(22) Filed: Oct. 10, 2022

(51) Int. Cl.
*H05K 7/14* (2006.01)

(52) U.S. Cl.
CPC ......... *H05K 7/1489* (2013.01); *H05K 7/1492* (2013.01)

(58) Field of Classification Search
CPC ........................... H05K 7/1489; H05K 7/1492
USPC ............................... 248/220.22; 211/119.004
See application file for complete search history.

(56) References Cited

U.S. PATENT DOCUMENTS 1,554,161 A * 9/1925 Hubbard ................... E05D 3/06 16/368
5,282,293 A * 2/1994 Pedoeem .............. E05D 11/082 16/371
6,658,696 B2 * 12/2003 Buckelew ............... E05D 11/00 16/86 B
7,137,606 B2 * 11/2006 Conway .................. F16L 3/015 248/220.22
7,473,846 B2 * 1/2009 Doerr ................... H05K 7/1491 174/72 A
8,024,019 B2 * 9/2011 Miyaoka ............. H04M 1/0237 174/520
8,045,343 B2 * 10/2011 Fan ...................... H05K 7/1491 361/825
9,769,947 B1 * 9/2017 Sands .................. H05K 7/1491
10,292,301 B1 * 5/2019 Chen .................... H01R 9/2416
11,245,252 B2 * 2/2022 Chen ...................... H02G 11/00
11,535,161 B1 * 12/2022 Walker ...................... B60R 3/02
11,683,905 B1 * 6/2023 An ....................... H05K 7/1409 361/679.02
11,814,887 B2 * 11/2023 Fisher .................... A47G 1/166
2005/0257344 A1 * 11/2005 Allen ...................... D06F 81/02 16/371
2008/0216288 A1 * 9/2008 Hoffman ................. E05D 3/127 296/202
2017/0367207 A1 * 12/2017 Chen .................... H05K 7/1489
2019/0245334 A1 * 8/2019 Chen .................... H02G 3/0456
2020/0120829 A1 * 4/2020 Chen ....................... F16L 3/015
2021/0378123 A1 * 12/2021 Chang ................... G06F 1/1635
2023/0055099 A1 * 2/2023 Russo, Jr. ................. E05D 5/02

* cited by examiner

*Primary Examiner* — Muhammad Ijaz
(74) *Attorney, Agent, or Firm* — Dergosits & Noah LLP; Todd A. Noah

(57) ABSTRACT

An apparatus is provided for connecting a power distribution unit (PDU) to a rack where the apparatus allows for re-positioning the PDU between a deployed position for normal use and a retracted position for shipping. The re-positioning may be accomplished without disconnecting the PDU from the rack, or from a power supply. The apparatus includes three hinged elements that are rotatable with respect to each other to attain the deployed or retracted position.

19 Claims, 10 Drawing Sheets

MULTI-POSITION PDU MOUNTING BRACKET

FIELD OF THE INVENTION

The present subject matter relates generally to brackets and more specifically to brackets that provide multiple configurations.

BACKGROUND

Typically, based on customer requirements, all rack power distribution units (PDUs) must remain fully operational and connected during a service event. However, there are items within the rack that cannot be serviced if a PDU is mounted in a conventional fashion. When mounted conventionally, the rack's existing door may not be used during a service event, since its use would require that the PDUs be moved.

In addition, data center requirements often restrict the extent to which a PDU can extend beyond the rack frame. Furthermore, crates used to ship racks are typically limited to only 3.5 inches of clearance beyond the rack frame, which is insufficient to allow shipment of a rack with a PDU mounted in a conventional fashion.

Thus, what is needed is PDU mounting bracket that provides first configuration in which the PDU is deployed for normal use and a second configuration in which the PDU is retracted for shipping.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a mounting bracket with three main components: a rack-side mounting plate; a center plate; and a PDU-side mounting plate, with hinges connecting the center plate to the mounting plates on either side. When the rack mounting bracket is attached to a rack frame, the bracket may be moved between two configurations: a shipping configuration and a deployed configuration. With a PDU mounted to the bracket, and the bracket in the shipping configuration, the PDU is positioned partially within the rack when viewed from the side of the rack, and is entirely within the outline of the rack frame when viewed from the front of the rack. This allows the rack with PDU to be crated for shipping. Even then, the shipping configuration allows access to the face of the rack-mounted devices.

With a PDU mounted to the bracket, and the bracket in the deployed configuration, the PDU is positioned in front of the rack when viewed from the side of the rack, and outside of the outline of the rack frame when viewed from the front of the rack. This allows a user to access the devices within the rack, e.g., for servicing, without a need to move, remove, or disconnect the PDU.

In an embodiment, each bracket is provided with two holes on the PDU-side plate and a single hole on the rack-side plate. When in the deployed configuration, a locking quick-release pin may be inserted through the more rearward of the PDU-side holes and the rack-side hole to secure the design in the deployed configuration. When in the shipping configuration, a locking quick-release pin can be inserted through the more forward of the PDU-side holes and the rack-side hole to secure the design in the shipping configuration.

In an embodiment, the bracket is symmetrical about a centerline and may be rotated about the centerline and used to secure a PDU to either side of a rack face. Similarly, a bracket may be provided with multiple PDU mounting slots, which facilitate using the bracket on either side of the rack, and at the top or bottom of the PDU. In other words, four alike brackets may be used to attach two PDUs to a rack, one bracket at the top and bottom of each PDU.

Figure 1:
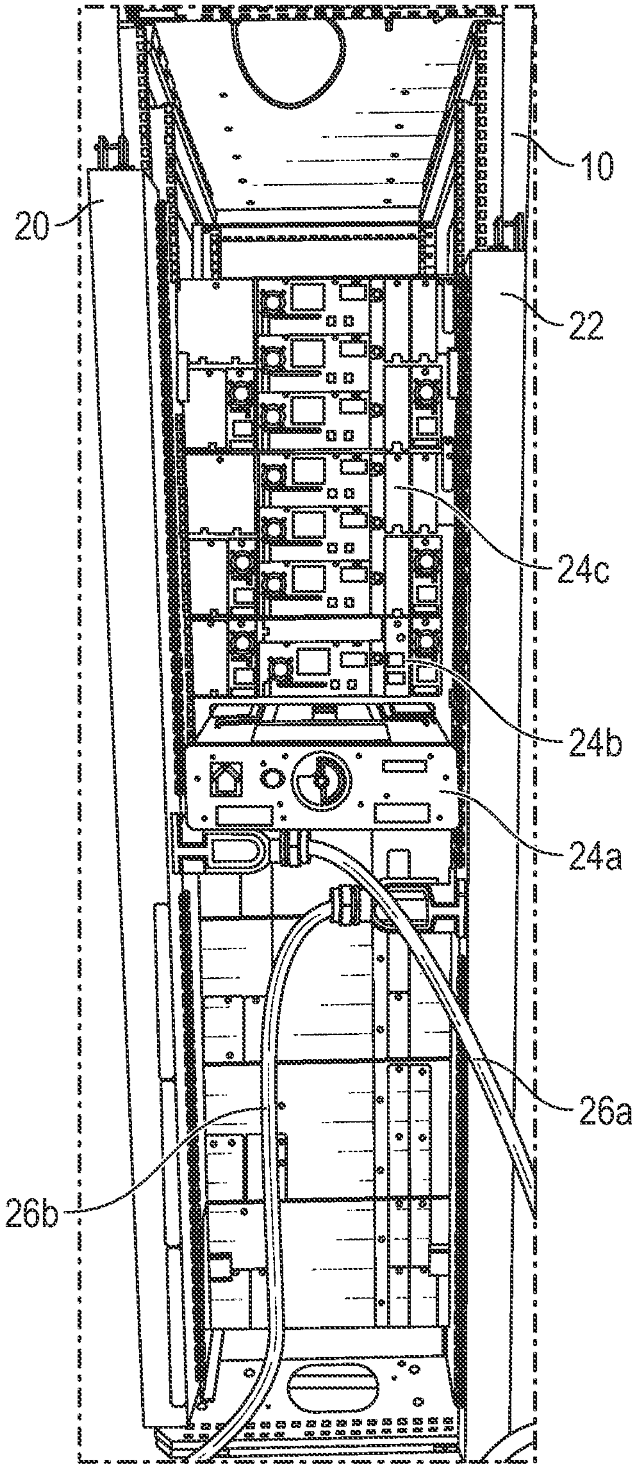
FIG. 1 illustrates the use of an embodiment of a multi-position PDU mounting bracket to position PDUs in a deployed position.

FIG. 1 illustrates the use of an embodiment of a multi-position PDU mounting bracket to position PDUs in a deployed position. In FIG. 1, PDUs 20 and 22 are attached to either side of a rack 10. PDUs 20 and 22 are shown in a deployed position in which the extend forward from 10 and laterally outward so they are beyond the front frame of rack

10. With PDUs 20 and 22 in this deployed configuration, rack-mounted devices 24*a* . . . 24*c* may be accessed without moving or disconnecting power supply lines 26*a* or 26*b* from PDUs 20 and 22. Device 24*a* is shown in an extended position to illustrate that it may be serviced without PDUs 20 or 22 interfering.

Figure 2:
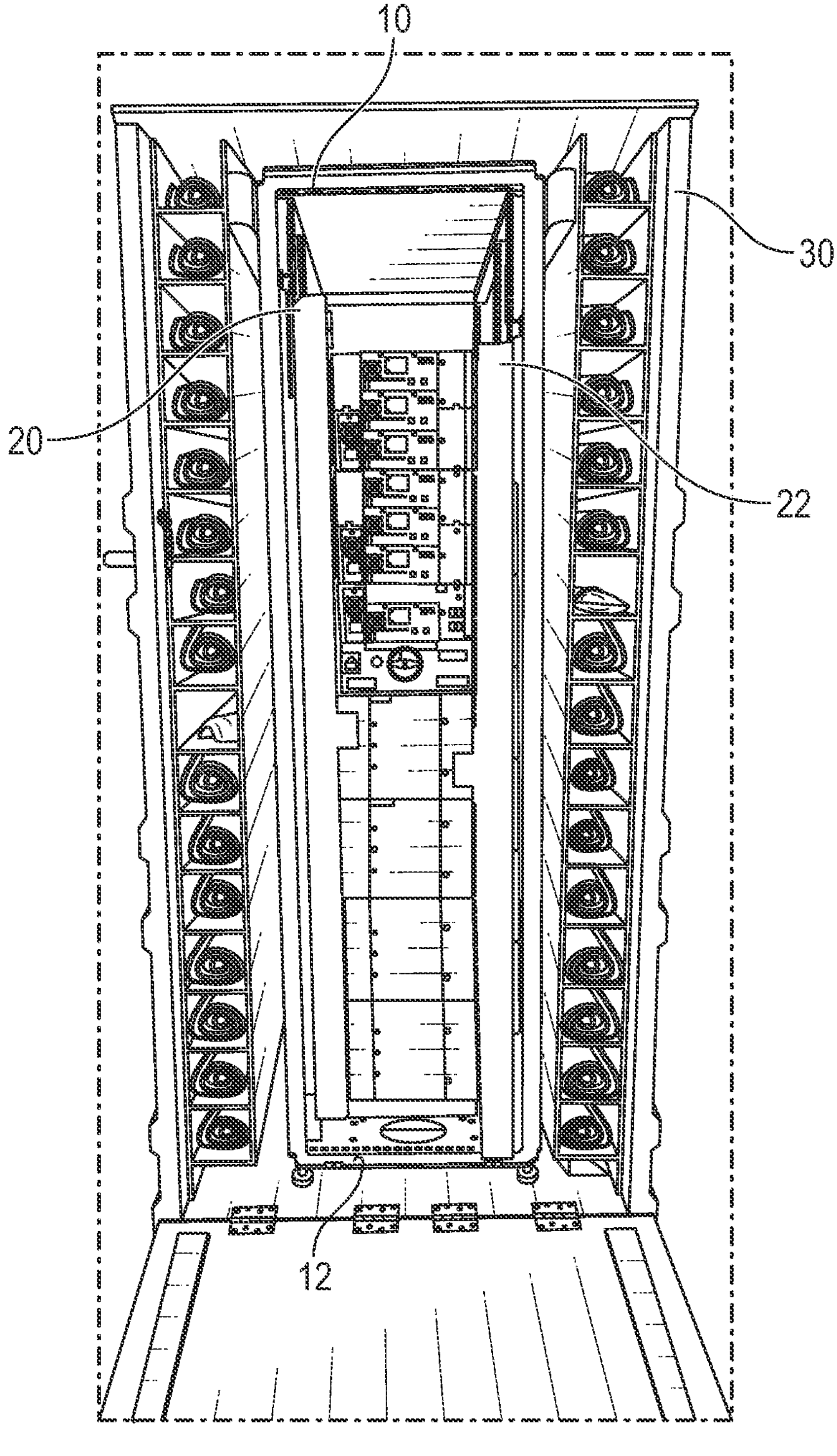
FIG. 2 illustrates the use of an embodiment of multi-position PDU mounting brackets to position PDUs in shipping positions.

FIG. 2 illustrates the use of an embodiment of multi-position PDU mounting bracket to position PDUs in shipping positions deployed position. In FIG. 2, both PDU 20 and PDU 22 are shown in shipping positions in which they have been moved laterally inward and back. This has resulted in PDUs 20, 22 being entirely within the frame of rack 10 as seen from the front. As shown, and with these specific PDUs, each extends 4.25 forward from the face of the rack when in the deployed position, and 3.25 inches forward from the face of the rack when in the shipping position. With PDUs 20 and 22 in these shipping configurations, rack 10 may be placed in a crate 30 without having to remove PDUs 20 or 22. Also, with PDU 20 in these shipping configurations, rack-mounted devices 24*a* . . . 24*c* may still be accessed.

Figure 3:
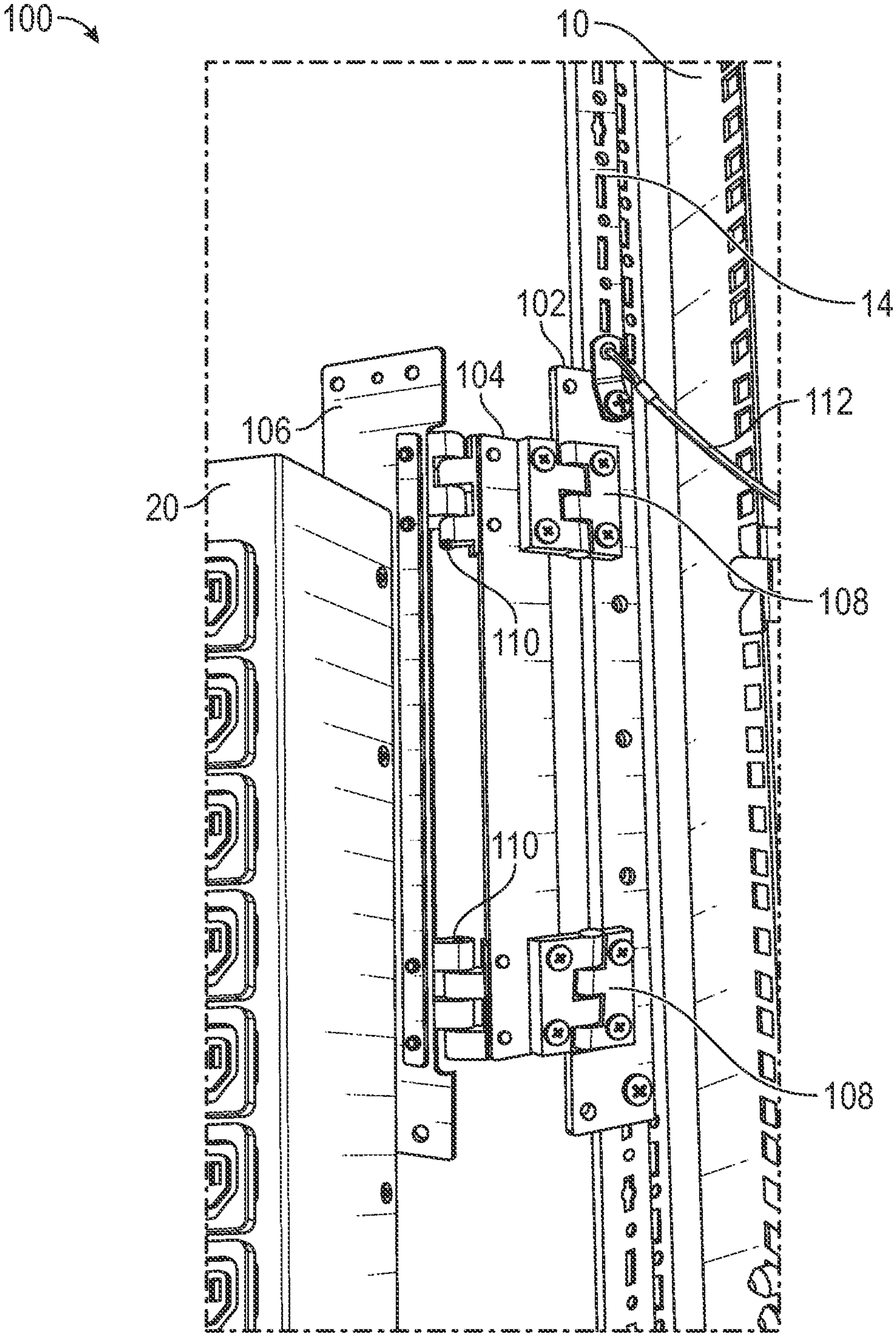
FIG. 3 is a front right isometric view illustrating an embodiment of a multi-position PDU mounting bracket in an extended position.

FIG. 3 is a front right isometric view illustrating an embodiment of a multi-position PDU mounting bracket in an extended position, which is an intermediate position between the deployed configuration of FIG. 1 and the shipping configuration of FIG. 2. In FIG. 3, a PDU mounting bracket 100 is shown that makes possible the change between the deployed and shipping configurations of FIG. 1 and FIG. 2. Mounting bracket 100 includes a rack-side plate (or "leaf") 102, a center plate (or "leaf") 104, and a PDU-side plate (or "leaf") 106. Rack-side plate 102 is joined to center plate 104 using hinges 108. Center plate 104 is joined to PDU-side plate 106 using hinges 110. Bracket 100 is mounted to rack 10 by connecting plate 102 to a rack side rail 14. Bracket 100 is mounted to PDU 20 by connecting PDU-side plate 106 to the back of PDU 20 (see, e.g., FIG. 8A and FIG. 8B). A lanyard 112 leads to a set pin 128 (FIG. 6C), which may be used to fix bracket in either the deployed or shipping configurations, as will be shown.

In FIG. 3, hinges 108 are oriented with their barrels inward, which allows center plate 104 to be rotated inwardly approximately 180 degrees with respect to rack-side plate 102, or until center plate 104 is again parallel with rack-side plate 102. The same orientation of hinges 108 allows center plate 104 to be rotated outwardly past the perpendicular to rack-side plate 102.

Hinges 110 are oriented with their barrels outward, which allows PDU-side plate 106 to be rotated outwardly approximately 180 degrees with respect to center plate 104, or until PDU-side plate 106 is parallel with center plate 104. The same orientation of hinges 110 allows PDU-side plate 106 to be rotated inwardly past the perpendicular to center plate 104.

Figure 4A:
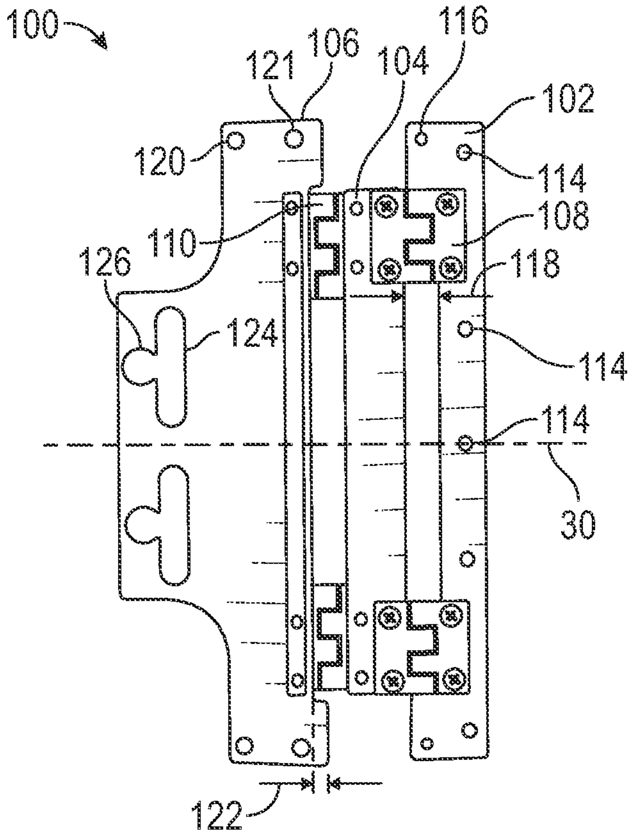
FIG. 4A is a right-side view illustrating an embodiment of a multi-position PDU mounting bracket in an extended configuration.

FIG. 4A is a right-side view illustrating an embodiment of a multi-position PDU mounting bracket in the extended configuration as shown in FIG. 3, in which the inwardly-facing sides of plates 102, 104, 106 are shown. In FIG. 4A, PDU mounting bracket 100 is shown to be symmetrical about a centerline 30. One of skill will recognize that such symmetry is not necessary in all embodiments. Mounting bracket 100 includes rack mounting hole 114 for connecting plate 102 to rack face 14. Plate 106 includes slots 124 through which fasteners may be passed and connected to PDUs 20 or 22. For convenience, a post entry 126 may be included to admit the head of a fastener while the fastener is connected to a PDU. Rack-side plate 102 is shown to include a pin hole 116 and PDU-side plate 106 is shown to include pin holes 120, 121.

In the deployed configuration, pin holes 116 and 121 align and set pin 128 (FIG. 6C) may be passed through them to hold bracket 100 in the deployed configuration. In the shipping configuration, pin holes 116 and 120 align and set pin 128 (FIG. 6C) may be passed through them to hold bracket 100 in the shipping configuration.

PDU-side plate 106 is shown to include a notch 122. Notch 122 is configured to receive center plate 104 when plate 106 is rotated inwardly with respect to plate 104. Similarly, rack-side plate 102 is shown to include a notch 118 (partially obscured by hinges 108). Notch 118 is configured to receive center plate 104 when plate 104 is rotated outwardly with respect to plate 102.

Figure 4B:
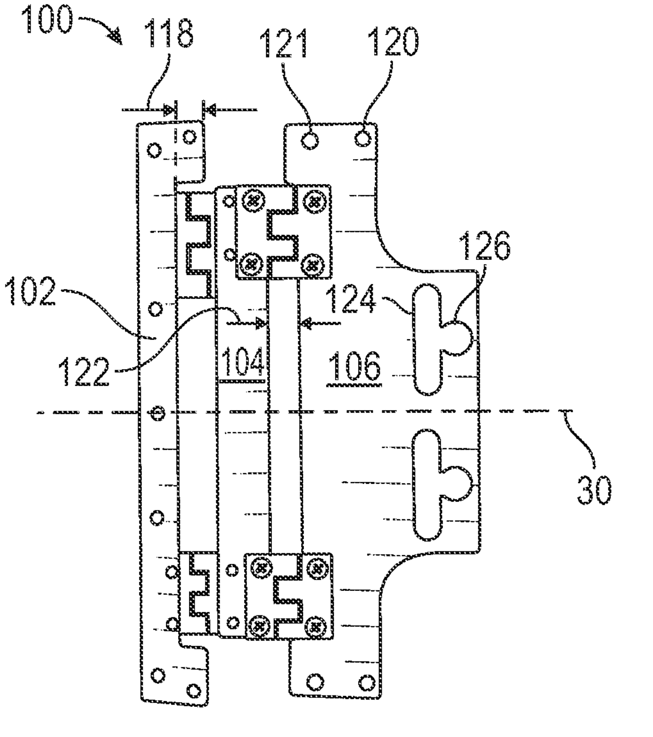
FIG. 4B is a left-side view illustrating an embodiment of a multi-position PDU mounting bracket in an extended configuration.

FIG. 4B is a left-side view illustrating an embodiment of a multi-position PDU mounting bracket in an extended configuration and shows notch 118 without obstruction.

Figure 5A:
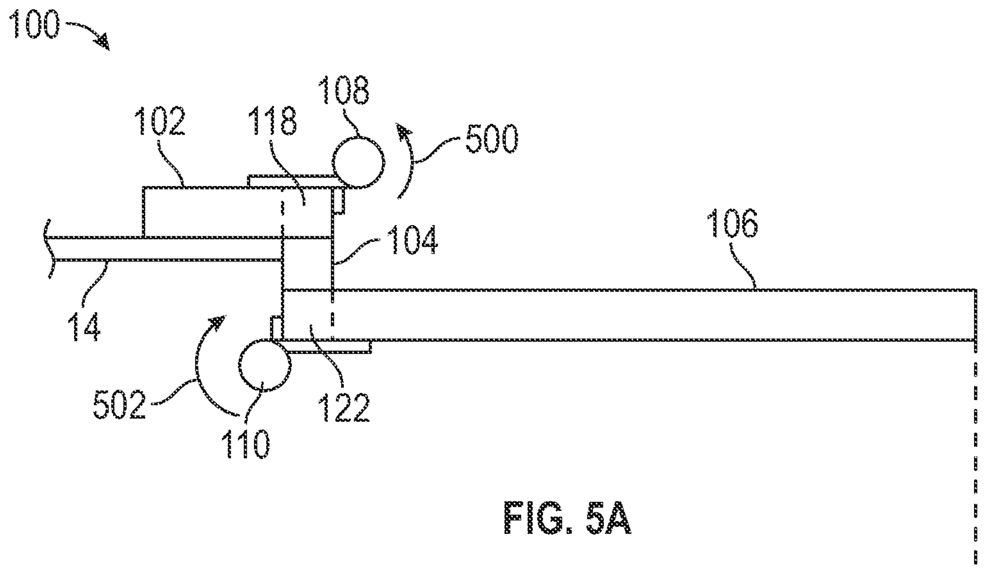
FIG. 5A is a top view illustrating an embodiment of a multi-position PDU mounting bracket in a deployed configuration.

FIG. 5A is a top view illustrating an embodiment of a multi-position PDU mounting bracket in a deployed configuration. In FIG. 5A, as in FIG. 3, bracket 100 is mounted to rack rail 14. In this configuration, center plate 104 is received in both notch 118 and in notch 122. Hinges 108 are oriented with their barrels inward, which allows center plate 104 to be rotated inwardly (counter-clockwise (CCW) 500) with respect to rack-side plate 102. In the embodiment, hinges 108 have a maximum swiveling range of 270 degrees. In FIG. 5A, hinges 108 are at their maximum 270-degree swivel range. Also, further rotation would be prevented by an interference between center plate 104 and rack-side plate 102. Thus, the orientation of hinges 108 at their maximum, and the presence of center plate 104 within notch 118, causes an interference that prevents center plate 104 from being rotated further outwardly past the perpendicular to rack-side plate 102 that is shown in FIG. 5A.

Hinges 110 are oriented with their barrels outward, which allows PDU-side plate 106 to be rotated outwardly (clockwise (CW) 502) with respect to center plate 104. In the embodiment, hinges 110 also have a maximum swiveling range of 270 degrees. In FIG. 5A, hinges 110 are at their maximum 270-degree swivel range and further rotation would be prevented by an interference between center plate 104 and PDU-side plate 106. Thus, the orientation of hinges 110 at their maximum, and the presence of center plate 104 within notch 122, causes an interference that prevents PDU-side plate 106 from being rotated further inwardly past the perpendicular to center plate 104 that is shown in FIG. 5A.

Figure 5B:
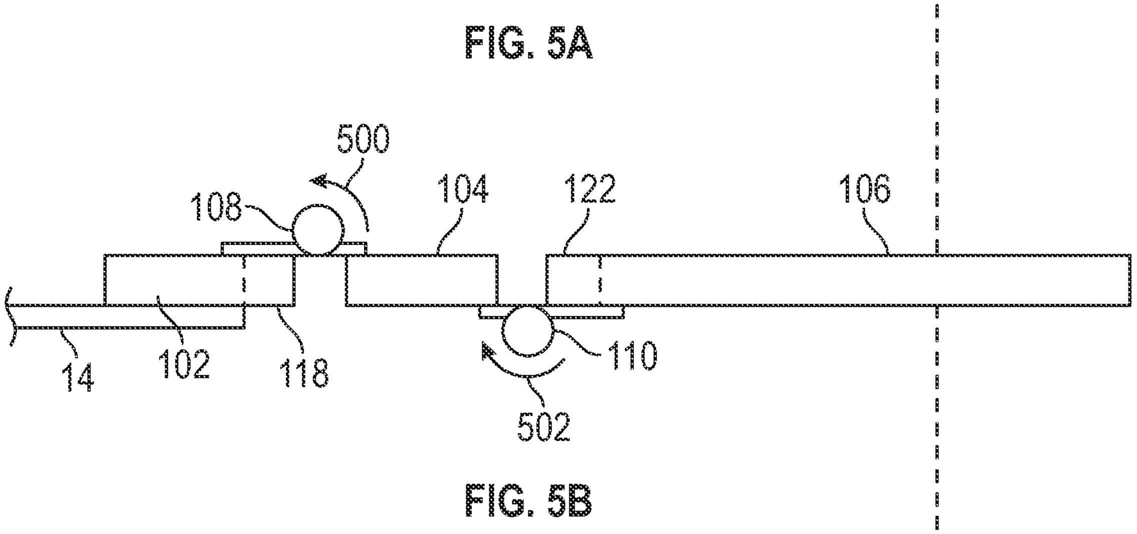
FIG. 5B is a top view illustrating an embodiment of a multi-position PDU mounting bracket in an extended configuration.

FIG. 5B is a top view illustrating an embodiment of a multi-position PDU mounting bracket in an extended configuration similar to that shown in FIG. 3. From this configuration, PDU-side plate 106 may be rotated 90 degrees C. CW 500 and 180 degrees C. W 502. From this configuration, center plate 104 may be rotated 180 degrees C. CW 500 and 90 degrees C. W 502.

Figure 5C:
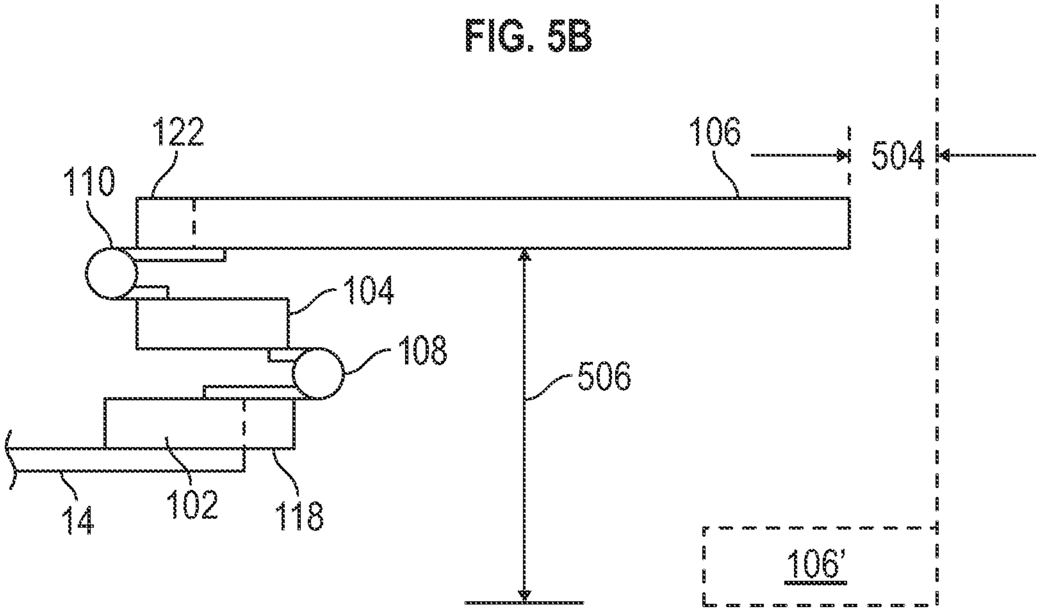
FIG. 5C is a top view illustrating an embodiment of a multi-position PDU mounting bracket in a retracted or shipping configuration.

FIG. 5C is a top view illustrating an embodiment of a multi-position PDU mounting bracket in a retracted or shipping configuration. FIG. 5C illustrates that the change from the deployed configuration to the shipping configuration results from a 270 degree C. CW 500 rotation of center plate 104 with respect to rack-side plate 102 and a 270 CW 502 rotation of PDU-side plate 106 with respect to center plate 104. FIG. 5C includes a PDU-side plate 106' that indicates the position of PDU-side plate 106 when in the deployed configuration. In FIG. 5C the comparison of PDU-side plate 106 to PDU-side plate 106' illustrates that PDU-side plate 106 extends forward a distance 504 and laterally a distance 506 further in the deployed configuration than in the shipping configuration.

Figure 6A:
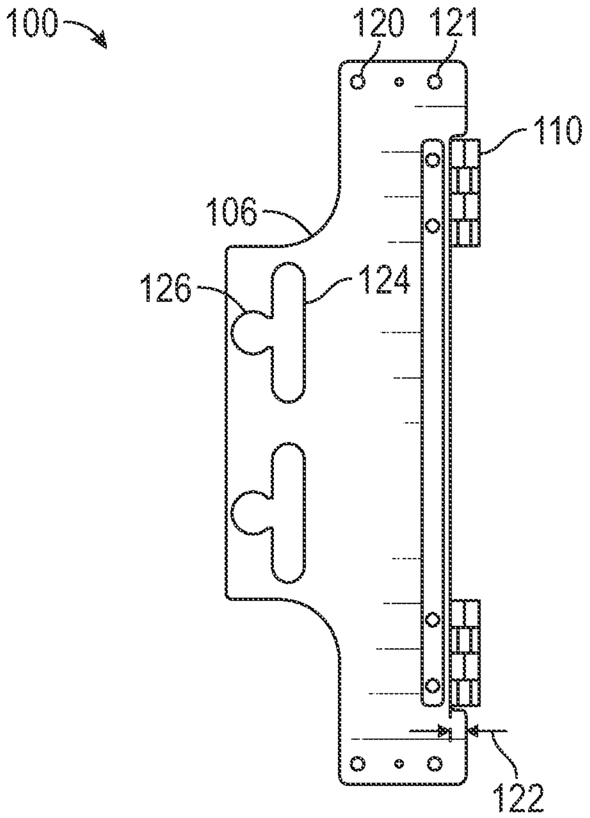
FIG. 6A is a right-side view of an embodiment of a multi-position PDU mounting bracket in a retracted or shipping configuration.
Figure 6B:
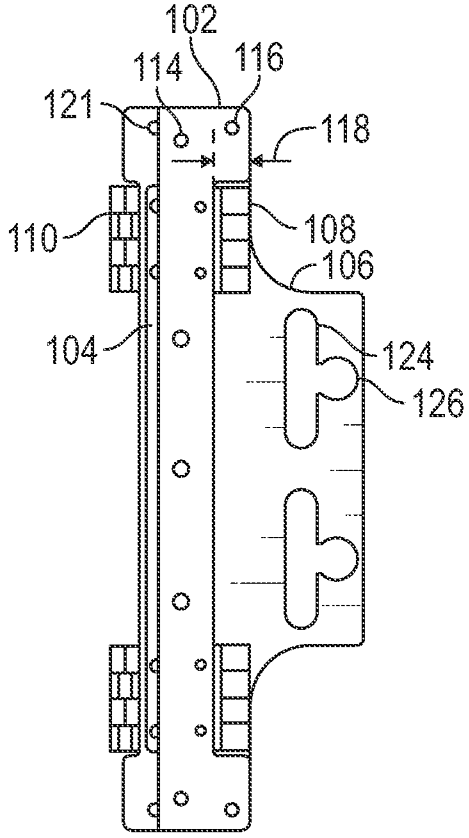
FIG. 6B is a left-side view of an embodiment of a multi-position PDU mounting bracket in a retracted or shipping configuration.
Figure 6C:
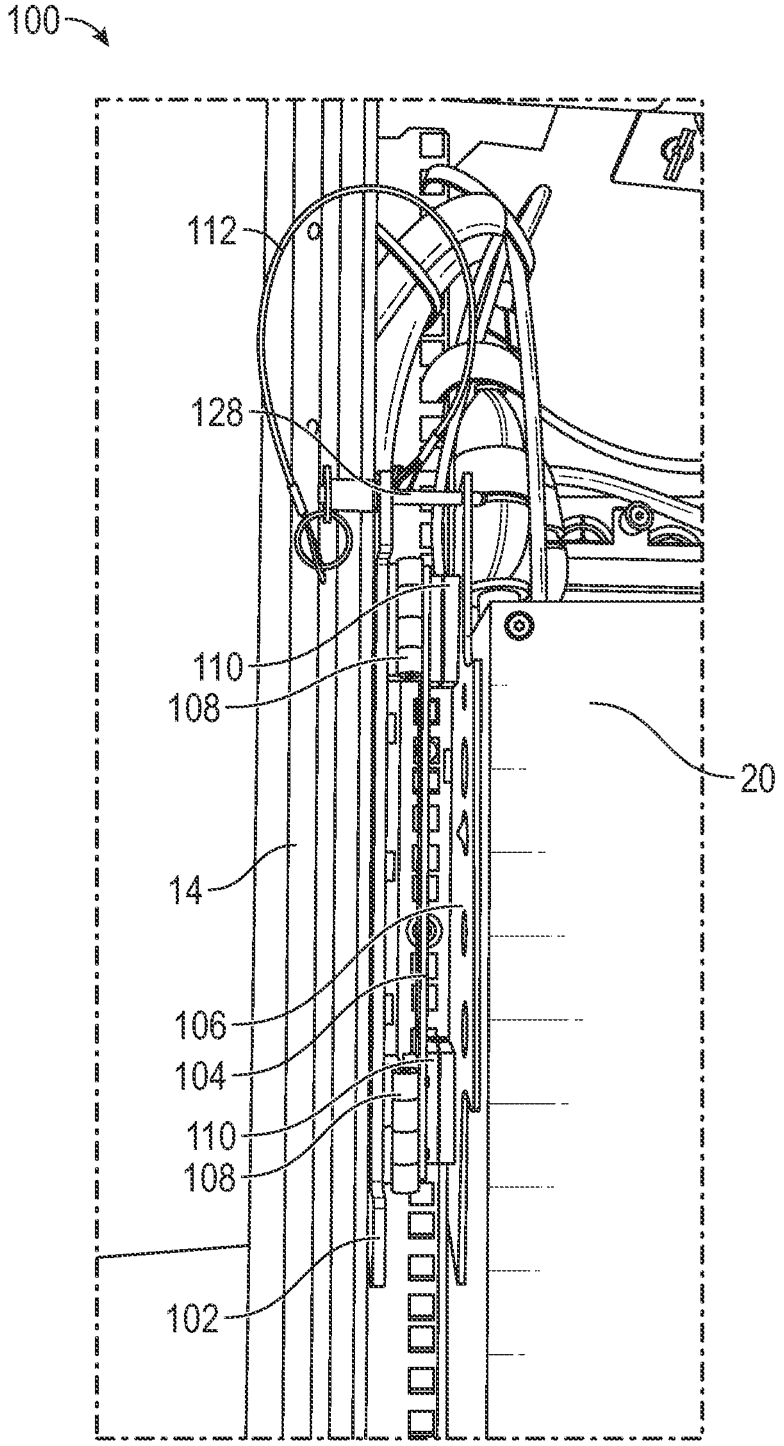
FIG. 6C is a front view of an embodiment of a multi-position PDU mounting bracket in a retracted or shipping configuration.
Figure 6D:
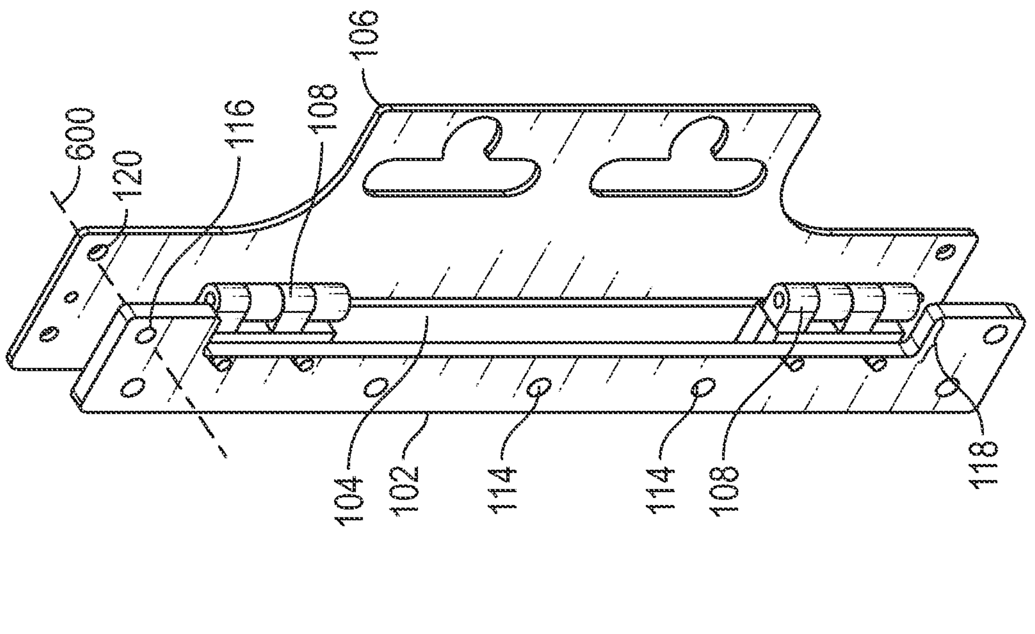
FIG. 6D is an upper front left isometric view of an embodiment of a multi-position PDU mounting bracket in a retracted or shipping configuration.

FIG. 6A is a right-side view of an embodiment of a multi-position PDU mounting bracket in a retracted or shipping configuration corresponding to FIG. 5C. FIG. 6B is a left-side view of an embodiment of a multi-position PDU mounting bracket in a retracted or shipping configuration corresponding to FIG. 5C. FIG. 6C is a front view of an embodiment of a multi-position PDU mounting bracket in a retracted or shipping configuration and attached to an upper corner of PDU 20. FIG. 6D is an upper front left isometric view of an embodiment of a multi-position PDU mounting bracket in a retracted or shipping configuration showing a pin position 600. FIG. 6A-FIG. 6D illustrate that, in the shipping configuration, PDU-side plate 106 is displaced inwardly from rack rail 14 and that set pin 128 may be passed through pin holes 116 and 120 and remain in position 600 to retain bracket 100 in the shipping configuration.

Figure 7:
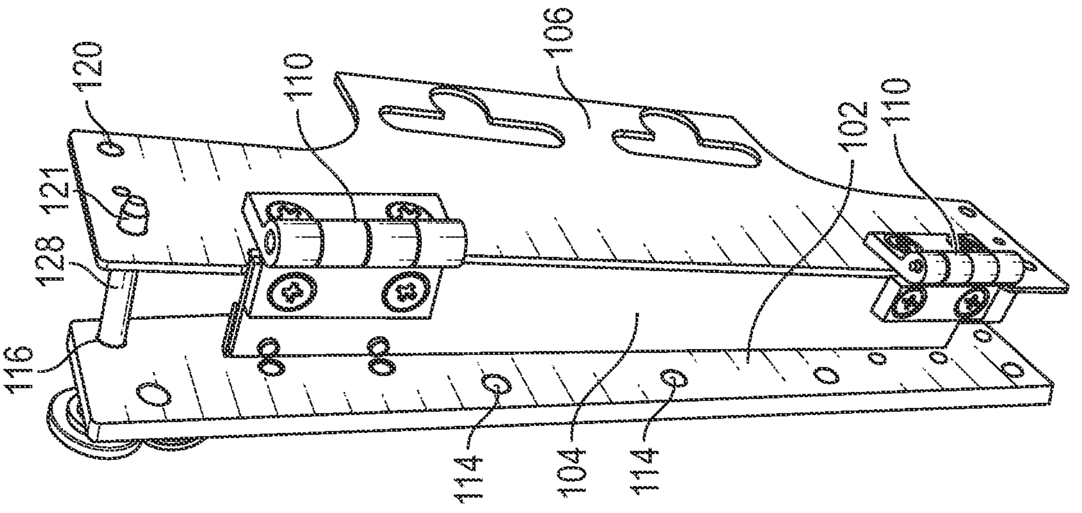
FIG. 7 is an upper rear left isometric view of an embodiment of a multi-position PDU mounting bracket in a deployed configuration.

FIG. 7 is an upper rear left isometric view of an embodiment of a multi-position PDU mounting bracket in a deployed configuration corresponding to FIG. 5A. In FIG. 7, center plate 104 is received in both notch 118 of plate 102 and in notch 122 of plate 106. Hinges 108 are oriented with their barrels inward and so are obscured. The orientation of hinges 108, and the presence of center plate 104 within notch 118, causes an interference that prevents center plate 104 from being rotated further outwardly past the perpendicular to rack-side plate 102 that is shown in FIG. 7. Similarly, hinges 110 are oriented with their barrels outward. The orientation of hinges 110, and the presence of center plate 104 within notch 122, causes an interference that prevents PDU-side plate 106 from being rotated further inwardly past the perpendicular to center plate 104 that is shown in FIG. 7. FIG. 7 also illustrates that set pin 128 may be passed through pin holes 116 and 121 to maintain bracket 100 in the deployed configuration.

Figure 8A:
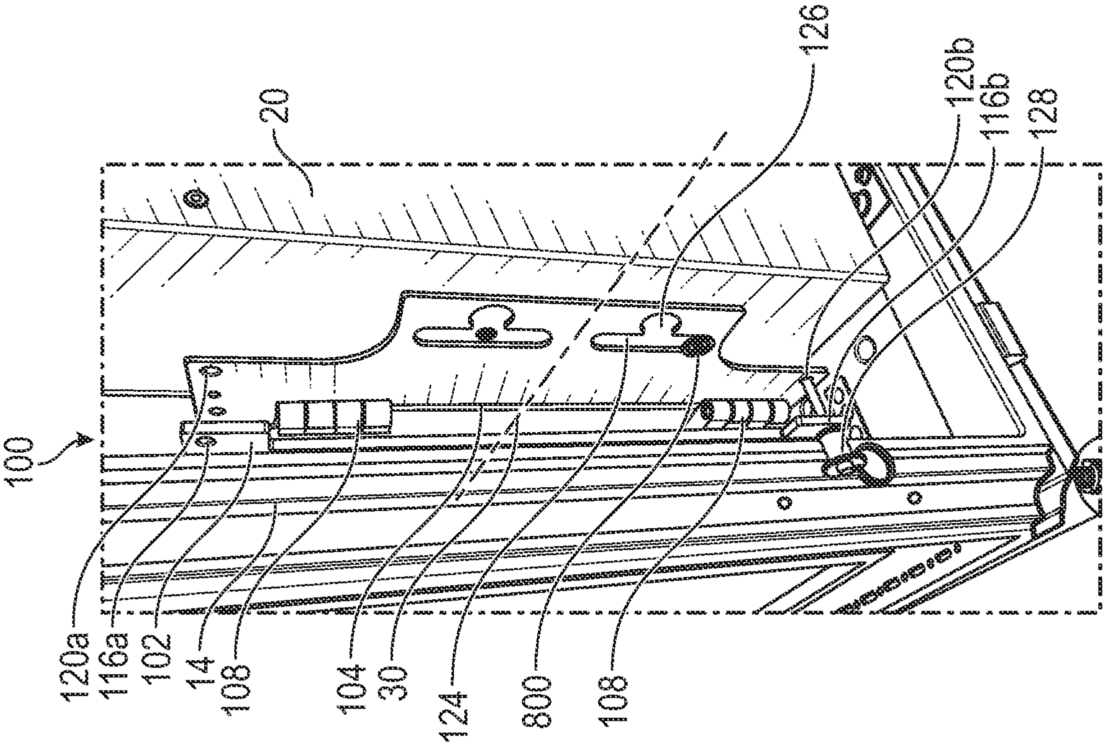
FIG. 8A is a front left isometric view of an embodiment of a multi-position PDU mounting bracket in a retracted or shipping configuration in a use case.

FIG. 8A is a front left isometric view of an embodiment of a multi-position PDU mounting bracket in a retracted or shipping configuration in a use case. In FIG. 8A, PDU 20 has been secured at a lower corner to mounting bracket 100 using a fastener 800 within the lower instantiation of slot 124. For example, fastener 800 may be installed into PDU 20 and then PDU 20 maneuvered so that the head of fastener 800 may be received through post entry 126. PDU 20 may then be further maneuvered so that fastener 800 is received within slot 124. FIG. 8A illustrates that in the embodiment, which is symmetrical about centerline 30, bottom pin holes 116*b* and 120*b*, like top pin holes 116, 120, align to permit set pin 128.

Figure 8B:
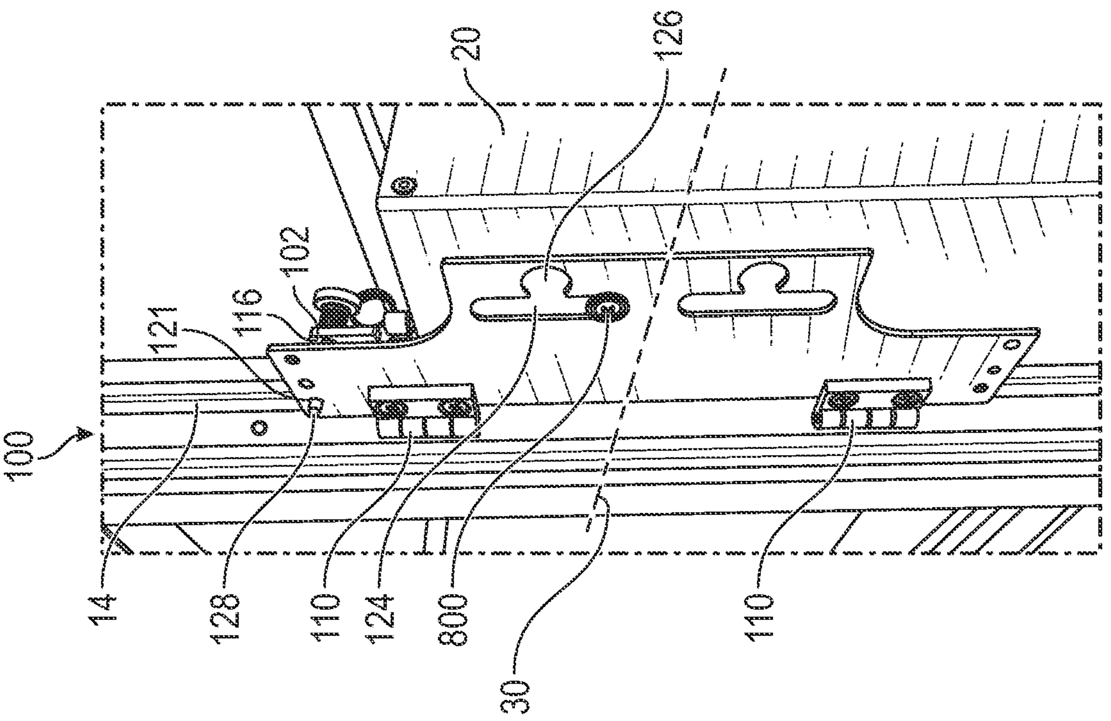
FIG. 8B is a front left isometric view of an embodiment of a multi-position PDU mounting bracket in a deployed configuration in a use case.

FIG. 8B is a front left isometric view of an embodiment of a multi-position PDU mounting bracket in a deployed configuration in a use case. In FIG. 8B, PDU 20 has been secured at an upper corner to mounting bracket 100 using a fastener 800 within the upper instantiation of slot 124.

Figure 9A:
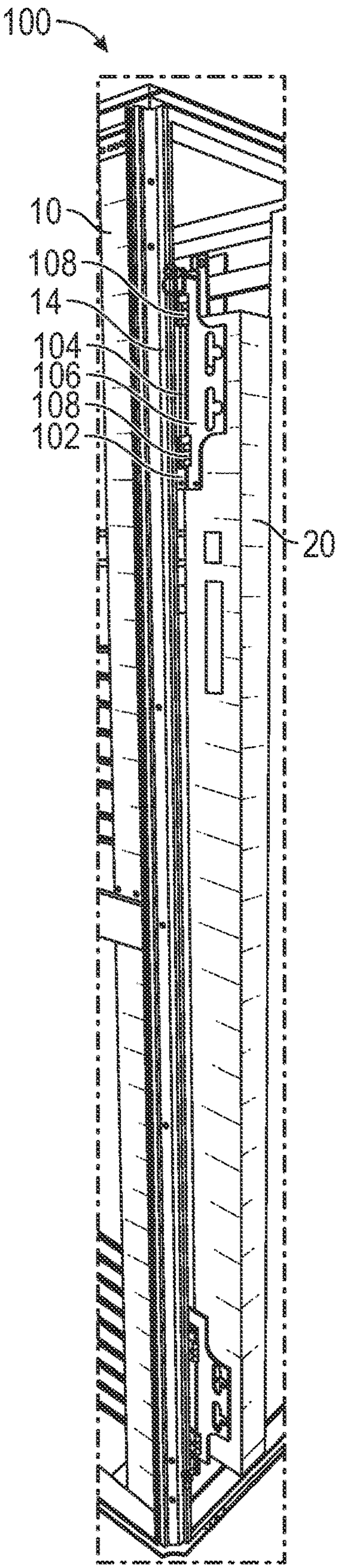
FIG. 9A is a front left isometric view of an embodiment of a multi-position PDU mounting bracket in a retracted or shipping configuration in a use case.
Figure 9B:
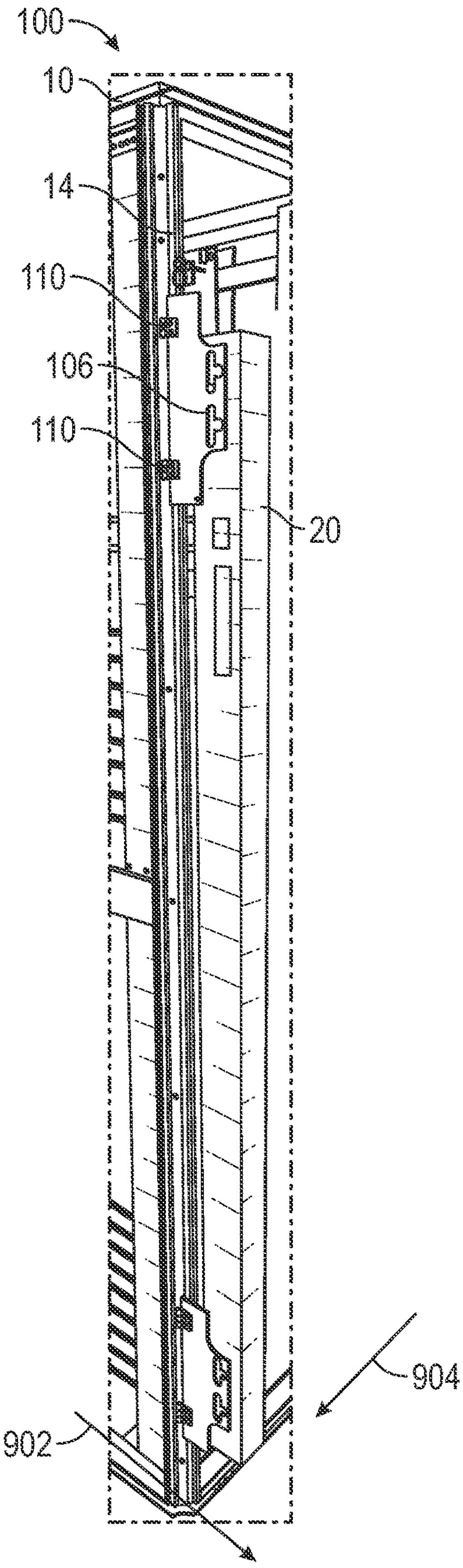
FIG. 9B is a front left isometric view of an embodiment of a multi-position PDU mounting bracket in a deployed configuration in a use case.

FIG. 9A is a front left isometric view of an embodiment of a multi-position PDU mounting bracket in a retracted or shipping configuration in a use case corresponding to FIG. 8A. FIG. 9B is a front left isometric view of an embodiment of a multi-position PDU mounting bracket in a deployed configuration in a use case corresponding to FIG. 8B. FIG. 9A and FIG. 9B illustrate that in the deployed configuration of FIG. 9B, PDU 20 extends in direction 902 forward and in direction 904 outwardly, in comparison to the position of FIG. 9A. The net extension in direction 902 is equal to the distance 504 (FIG. 5C) and the net extension in direction 904 is equal to the distance 506 (FIG. 5C).

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:

a first leaf configured to mount to a chassis;

a second leaf joined to the first leaf using a first hinge such that the second leaf is rotatable 270 degrees between a first position that is perpendicular to the first leaf to a second position that is in line with the first leaf to a third position that is parallel to the first leaf; and a third leaf configured to connect to a device and joined to the second leaf using a second hinge such that the third leaf is rotatable 270 degrees between a fourth position that is perpendicular to the second leaf to a fifth position that is in line with the second leaf to a sixth position parallel to the first leaf.

2. The apparatus of claim 1, wherein when the second leaf is in the first position, and the third leaf is in the fourth position, the third leaf is parallel to the first leaf and displaced a first direction from a plane defined by the first leaf.

3. The apparatus of claim 2, wherein when the second leaf is in the third position, and the third leaf is in the sixth position, the third leaf is parallel to the first leaf and displaced in a second direction opposite the first direction from the plane defined by the first leaf.

4. The apparatus of claim 3, wherein the first leaf includes a first notch configured to receive at least part of the second leaf when the second leaf is rotated from the second position to the first position.

5. The apparatus of claim 3, wherein the third leaf includes a second notch configured to receive at least part of the second leaf when the third leaf is rotated from the fifth position to the fourth position.

6. The apparatus of claim 3, wherein when the second leaf is in the second position, and the third leaf is in the fifth position, the first leaf, second leaf, and third leaf are parallel and the third leaf extends a first distance in the plane defined by the first leaf.

7. The apparatus of claim 6, wherein when the second leaf is in the first position and the third leaf is in the fourth position, the third leaf extends a second distance in the plane defined by the first leaf, the second distance being less than the first distance, and when the second leaf is in the third position and the third leaf is in the sixth position, the third leaf extends a third distance in the plane defined by the first leaf, the third distance being less than the second distance.

8. The apparatus of claim 3, wherein when the second leaf is in the first position and the third leaf is in the fourth position, a first hole in the first leaf and a second hole in the third leaf align such that a pin can be inserted through them, and when the second leaf is in the third position and the third leaf is in the sixth position, the first hole in the first leaf and a third hole in the third leaf align such that a pin can be inserted through them.

9. A system comprising:

a first leaf mounted to a chassis;

a second leaf joined to the first leaf using a first hinge such that the second leaf is rotatable 270 degrees between a first position that is perpendicular to the first leaf to a second position that is in line with the first leaf to a third position that is parallel to the first leaf; and a third leaf connected to a device mounted in the chassis and joined to the second leaf using a second hinge such that the third leaf is rotatable 270 degrees between a fourth position that is perpendicular to the second leaf to a fifth position that is in line with the second leaf to a sixth position parallel to the first leaf.

10. The system of claim 9, wherein when the second leaf is in the first position, and the third leaf is in the fourth position, the third leaf is parallel to the first leaf and displaced a first direction from a plane defined by the first leaf.

11. The system of claim 10, wherein when the second leaf is in the third position, and the third leaf is in the sixth position, the third leaf is parallel to the first leaf and displaced in a second direction opposite the first direction from the plane defined by the first leaf.

12. The system of claim 11, wherein the first leaf includes a first notch configured to receive at least part of the second leaf when the second leaf is rotated from the second position to the first position.

13. The system of claim 11, wherein the third leaf includes a second notch configured to receive at least part of the second leaf when the third leaf is rotated from the fifth position to the fourth position.

14. The system of claim 11, wherein when the second leaf is in the second position, and the third leaf is in the fifth position, the first leaf, second leaf, and third leaf are parallel and the third leaf extends a first distance in the plane defined by the first leaf.

15. The system of claim 14, wherein when the second leaf is in the first position and the third leaf is in the fourth position, the third leaf extends a second distance in the plane defined by the first leaf, the second distance being less than the first distance, and when the second leaf is in the third position and the third leaf is in the sixth position, the third leaf extends a third distance in the plane defined by the first leaf, the third distance being less than the second distance.

16. The system of claim 11, wherein when the second leaf is in the first position and the third leaf is in the fourth position, a first hole in the first leaf and a second hole in the third leaf align such that a pin can be inserted through them, and when the second leaf is in the third position and the third leaf is in the sixth position, the first hole in the first leaf and a third hole in the third leaf align such that a pin can be inserted through them.

17. A method comprising:

causing a first angle between a first leaf and a second leaf to be changed from 0 degrees to 270 degrees in a first direction, the first leaf being mounted to a chassis and rotatably connected to the second leaf by at least one first hinge such that when the angle between the first leaf and second leaf is at 0 degrees, the first leaf is parallel to the second leaf and when the first angle between the first leaf and the second leaf is at 270 degrees, the first leaf is perpendicular to the second leaf; and causing a second angle between the second leaf and a third leaf to be changed from 0 degrees to 270 degrees in a second direction, the second direction being opposite to the first direction, the third leaf being mounted to a device and rotatably connected to the second leaf by at least one second hinge such that when the second angle between the first leaf and second leaf is at 0 degrees, the second leaf is parallel to the third leaf and when the second angle between the second leaf and the third leaf is at 270 degrees, the second leaf is perpendicular to the third leaf.

18. The method of claim 17, further comprising removing a pin inserted in a first hole provided in the first leaf and a second hole provided in the third leaf when the first angle between the first leaf and second leaf is at 0 degrees and the second angle between the second leaf and third leaf is at 0 degrees.

19. The method of claim 17, further comprising inserting a pin in the first hole provided in the first leaf and a third hole provided in the third leaf when the first angle between the first leaf and second leaf is at 270 degrees and the second angle between the second leaf and third leaf is at 270 degrees.

* * * * *